US012599019B2

(12) United States Patent
Chen et al.

(10) Patent No.: US 12,599,019 B2
(45) Date of Patent: Apr. 7, 2026

(54) EMBEDDED PACKAGING STRUCTURE AND MANUFACTURING METHOD THEREOF

(71) Applicant: Zhuhai ACCESS Semiconductor Co., Ltd., Guangdong (CN)

(72) Inventors: Xianming Chen, Guangdong (CN); Yejie Hong, Guangdong (CN); Benxia Huang, Guangdong (CN); Gao Huang, Guangdong (CN)

(73) Assignee: Zhuhai ACCESS Semiconductor Co., Ltd., Guangdong (CN)

( * ) Notice: Subject to any disclaimer, the term of this patent is extended or adjusted under 35 U.S.C. 154(b) by 782 days.

(21) Appl. No.: 17/811,879

(22) Filed: Jul. 12, 2022

(65) Prior Publication Data

US 2023/0125220 A1      Apr. 27, 2023

(30) Foreign Application Priority Data

Oct. 27, 2021      (CN) .......................... 202111258705.X

(51) Int. Cl.
*H01L 23/498* (2006.01)
*H01L 21/48* (2006.01)
*H01L 23/13* (2006.01)

(52) U.S. Cl.
CPC ........ *H01L 23/4985* (2013.01); *H01L 21/486* (2013.01); *H01L 23/13* (2013.01); *H01L 23/49838* (2013.01)

(58) Field of Classification Search
None
See application file for complete search history.

(56) References Cited

U.S. PATENT DOCUMENTS

| 8,080,874 | B1 | 12/2011 | Werner et al. |
| 9,475,694 | B2 | 10/2016 | Martizon, Jr. et al. |

(Continued)

FOREIGN PATENT DOCUMENTS

| CN | 102903681 A | 1/2013 |
| CN | 108766954 A | 11/2018 |

(Continued)

OTHER PUBLICATIONS

Notice of Allowance issued for the Japanese Patent Application No. 2022-098878 on Jul. 25, 2023, 6 pages with English translation.
Notice of Allowance issued for the Korean Patent Application No. 10-2022-0070978 on May 8, 2024, 3 pages with English translation.
Search Report issued for the Taiwan Patent Application No. 111118792 on Mar. 20, 2022, 2 pages with English translation.

*Primary Examiner* — Dale E Page
*Assistant Examiner* — Patrick Cullen
(74) *Attorney, Agent, or Firm* — Buchalter; Jason W. Croft

(57) ABSTRACT

An embedded packaging structure and a manufacturing method thereof are disclosed. The method includes: providing a bearing plate with a first metal seed layer; processing on the first metal seed layer to obtain a substrate; removing the bearing plate to obtain the substrate, and processing on the substrate to obtain a first and a second cavities penetrating therethrough; assembling a first component in the first cavity, assembling a connecting flexible board in the second cavity, processing on a second side of the substrate to obtain a second insulating layer; processing on a first side of the substrate to obtain a second circuit layer, assembling a second component on the second circuit layer; bending the substrate through the connecting flexible board to form an included angle less than 180 degrees on the first side, and packaging the first side by using a packaging material to obtain a packaging layer.

8 Claims, 6 Drawing Sheets

(56) References Cited

U.S. PATENT DOCUMENTS

| | | | |
|---|---|---|---|
| 9,490,195 B1 * | 11/2016 | Prabhu | H01L 24/24 |
| 2004/0238857 A1 | 12/2004 | Beroz et al. | |
| 2009/0169837 A1 * | 7/2009 | An | H05K 3/4007 |
| | | | 428/209 |
| 2015/0228556 A1 * | 8/2015 | Lee | H01L 21/76802 |
| | | | 257/774 |
| 2016/0049344 A1 | 2/2016 | Andry et al. | |
| 2016/0118328 A1 | 4/2016 | Hu | |
| 2017/0018493 A1 * | 1/2017 | Lee | H01L 23/13 |
| 2017/0027058 A1 * | 1/2017 | Perkins | H05K 1/0218 |
| 2020/0043826 A1 | 2/2020 | Koller et al. | |
| 2020/0112081 A1 | 4/2020 | Kim et al. | |
| 2020/0176386 A1 | 6/2020 | Ham et al. | |
| 2020/0251407 A1 | 8/2020 | Chun et al. | |
| 2021/0090908 A1 * | 3/2021 | Renjan | H01L 24/13 |

FOREIGN PATENT DOCUMENTS

| | | | |
|---|---|---|---|
| CN | 109659239 | A | 4/2019 |
| DE | 10235797 | A1 | 2/2004 |
| JP | 2010199216 | A | 9/2010 |
| JP | 2011523068 | A | 8/2011 |
| JP | 2012151390 | A | 8/2012 |
| JP | 2014022516 | A | 2/2014 |
| JP | 2015520840 | A | 7/2015 |
| JP | 2017504977 | A | 2/2017 |
| JP | 2017163043 | A | 9/2017 |
| JP | 2019091789 | A | 6/2019 |
| KR | 102157942 | B1 | 9/2020 |

* cited by examiner

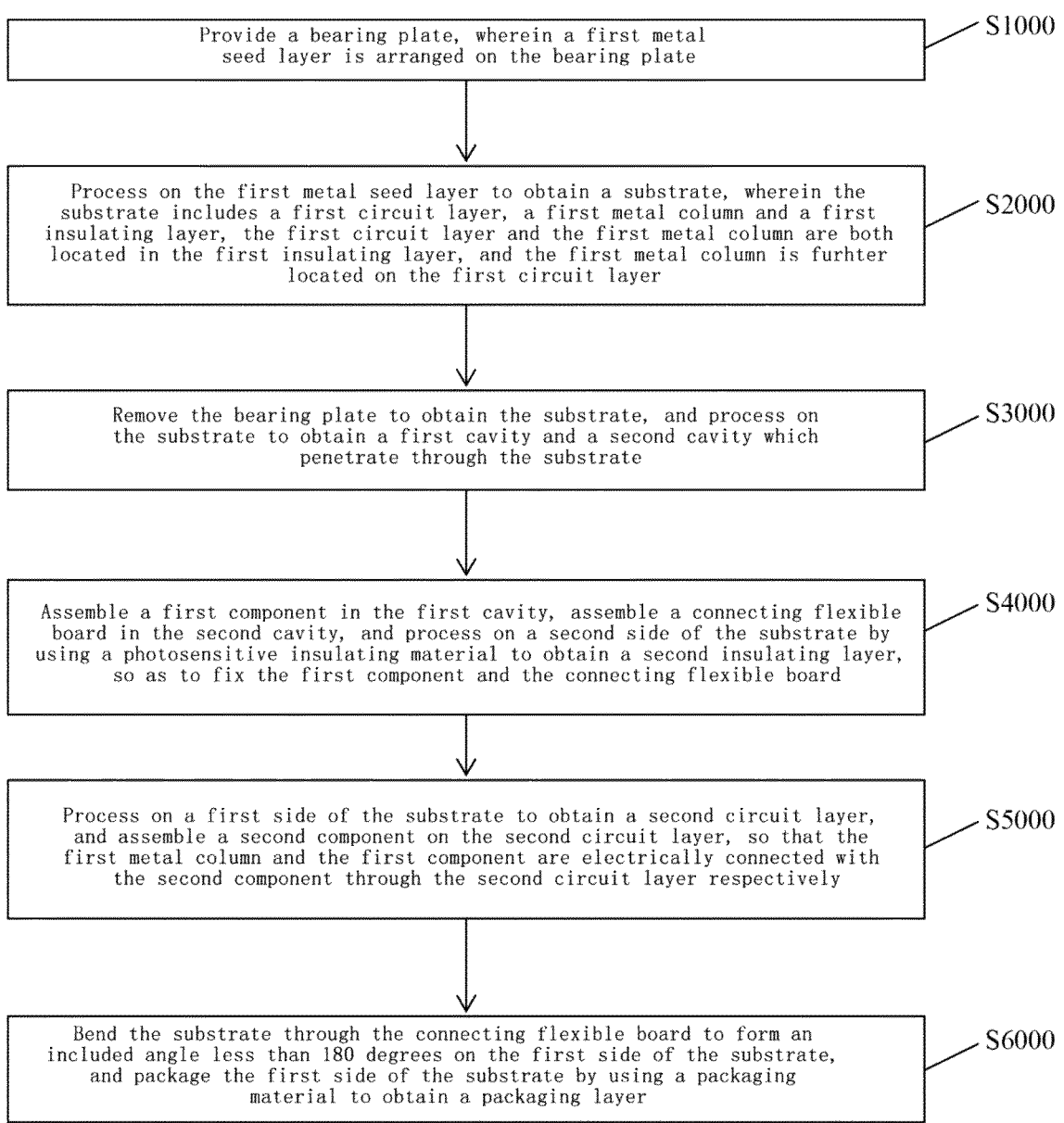

Provide a bearing plate, wherein a first metal seed layer is arranged on the bearing plate — S1000

Process on the first metal seed layer to obtain a substrate, wherein the substrate includes a first circuit layer, a first metal column and a first insulating layer, the first circuit layer and the first metal column are both located in the first insulating layer, and the first metal column is furhter located on the first circuit layer — S2000

Remove the bearing plate to obtain the substrate, and process on the substrate to obtain a first cavity and a second cavity which penetrate through the substrate — S3000

Assemble a first component in the first cavity, assemble a connecting flexible board in the second cavity, and process on a second side of the substrate by using a photosensitive insulating material to obtain a second insulating layer, so as to fix the first component and the connecting flexible board — S4000

Process on a first side of the substrate to obtain a second circuit layer, and assemble a second component on the second circuit layer, so that the first metal column and the first component are electrically connected with the second component through the second circuit layer respectively — S5000

Bend the substrate through the connecting flexible board to form an included angle less than 180 degrees on the first side of the substrate, and package the first side of the substrate by using a packaging material to obtain a packaging layer — S6000

FIG. 1

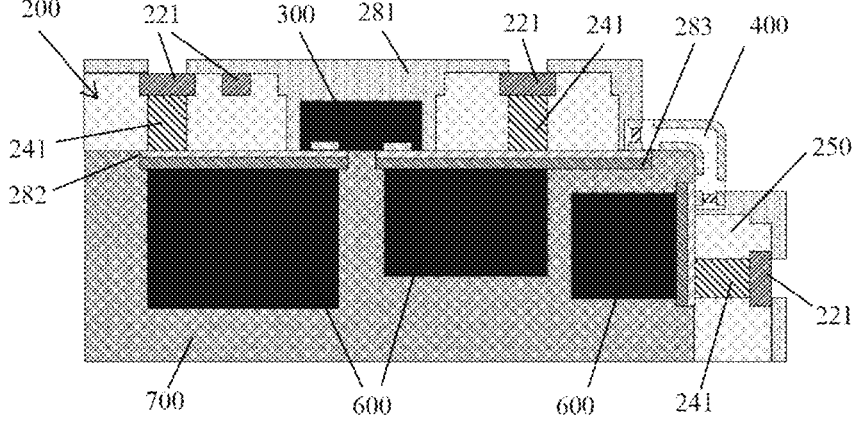
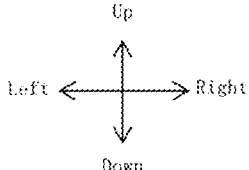
FIG. 17

EMBEDDED PACKAGING STRUCTURE AND MANUFACTURING METHOD THEREOF

CROSS-REFERENCE TO RELATED APPLICATION

This application is based on and claims the benefit of priority from Chinese Patent Application No. 202111258705X, filed on 27 Oct. 2021, the entirety of which is incorporated by reference herein.

TECHNICAL FIELD

The disclosure relates to the technical field of semiconductor packaging, and more particularly, to an embedded packaging structure and a manufacturing method thereof.

BACKGROUND

With the development of science and technology, current electronic device is developing towards miniaturization, light-weight and multifunction, leading to a more complicated integrated circuit and more components packaged in a semiconductor, which restricts the development of miniaturization and light weight of a package. At present, mainly applied packaging methods include Wire Bonding (WB) packaging and Flip chip (FC) packaging. However, in the two packaging methods, components need to be attached on a surface of a substrate in a tiled way. With the increase of the components, it is difficult to effectively reduce a size of the package in an X direction and a Y direction by current packaging methods, such that it is difficult for the package to meet the development requirements of high-density integration and miniaturization.

SUMMARY

The disclosure aims to solve at least one of the technical problems of existing technology. Therefore, the disclosure provides a manufacturing method of an embedded packaging structure, which can effectively improve manufacturing systems and methods by reducing a size of a package in one or both of an X direction and a Y direction.

The disclosure further provides an embedded packaging structure manufactured by the manufacturing methods described herein.

A manufacturing method of an embedded packaging structure according to an embodiment in a first aspect of the disclosure includes: providing a bearing plate, where a first metal seed layer is arranged on the bearing plate; processing on the first metal seed layer to obtain a substrate, where the substrate includes a first circuit layer, a first metal column and a first insulating layer, the first circuit layer and the first metal column are both located in the first insulating layer, and the first metal column is also located on the first circuit layer; removing the bearing plate to obtain the substrate, and processing on the substrate to obtain a first cavity and a second cavity which penetrate through the substrate; assembling a first component in the first cavity, assembling a connecting flexible board in the second cavity, and processing on a second side of the substrate by using a photosensitive insulating material to obtain a second insulating layer, so as to fix the first component and the connecting flexible board; processing on a first side of the substrate to obtain a second circuit layer, and assembling a second component on the second circuit layer, so that the first metal column and the first component are electrically connected with the second component through the second circuit layer respectively; and bending the substrate through the connecting flexible board to form an included angle less than 180 degrees on the first side of the substrate, and packaging the first side of the substrate by using a packaging material to obtain a packaging layer.

The manufacturing method of an embedded packaging structure according to the embodiment of the disclosure at least has the following beneficial effects: during manufacturing of the embedded packaging structure, the substrate is bent to obtain the substrate with a smaller size in an X direction and/or a Y direction, and then packaged to obtain the packaging structure with a smaller size in the X direction and/or the Y direction, which is beneficial for miniaturization and high-density integration of a package.

According to some embodiments of the disclosure, the processing on the first metal seed layer to obtain the substrate includes: processing on the first metal seed layer to obtain the first circuit layer, where the first circuit layer includes a first conductive circuit, a first sacrificial circuit and a second sacrificial circuit; processing on the first circuit layer to obtain the first metal column, where the first metal column includes a first conductive metal column located on the first conductive circuit, a first sacrificial metal column located on the first sacrificial circuit and a second sacrificial metal column located on the second sacrificial circuit; and processing between gaps of the first circuit layer and gaps of the first metal column by using the insulating material to obtain the first insulating layer, thereby obtaining the substrate.

According to some embodiments of the disclosure, the processing between gaps of the first circuit layer and gaps of the first metal column by using the insulating material to obtain the first insulating layer, thereby obtaining the substrate, includes: applying the insulating material on the first metal seed layer, so that the insulating material covers the first metal column and the first circuit layer to obtain an insulating base layer; and processing the insulating base layer, to expose an end portion of the first metal column from the insulating base layer to obtain the first insulating layer, thereby obtaining the substrate.

According to some embodiments of the disclosure, the processing on the substrate to obtain a first cavity and a second cavity which penetrate through the substrate includes: removing the first sacrificial circuit and the first sacrificial metal column to form the first cavity penetrating through the substrate; and removing the second sacrificial circuit and the second sacrificial metal column to form the second cavity penetrating through the substrate.

According to some embodiments of the disclosure, a first metal layer, a second metal layer and an etching barrier layer are sequentially arranged on the bearing plate, the first metal seed layer is located on the etching barrier layer, and the removing the bearing plate to obtain the substrate includes: splitting the first metal layer from the second metal layer, and sequentially removing the second metal layer, the etching barrier layer and the first metal seed layer by etching, so as to remove the bearing plate and obtain the substrate.

According to some embodiments of the disclosure, the assembling a first component in the first cavity and assembling a connecting flexible board in the second cavity, includes: mounting a temporary bearing layer on the first side of the substrate, where the first side of the substrate is opposite to the second side of the substrate, and the first circuit layer is located on the second side of the substrate; and pre-mounting the first component and the connecting flexible board on the temporary bearing layer, where the first component is located in the first cavity, and the connecting flexible board is located in the second cavity.

According to some embodiments of the disclosure, the processing on a second side of the substrate by using a photosensitive insulating material to obtain a second insulating layer further includes: removing the temporary bearing layer.

According to some embodiments of the disclosure, the processing on a first side of the substrate to obtain a second circuit layer includes: processing on the first side of the substrate to obtain a second metal seed layer; and processing on the second metal seed layer to obtain the second circuit layer.

An embedded packaging structure according to an embodiment in a second aspect of the disclosure is manufactured by the manufacturing method of an embedded packaging structure in the first aspect.

The embedded packaging structure according to the embodiment of the disclosure at least has the following beneficial effects: according to the embedded packaging structure manufactured by the manufacturing methods herein, the substrate is bent through the connecting flexible board, so that the size of the substrate is reduced in the X direction and/or the Y direction, which is beneficial for reducing the size of the embedded packaging structure in the X direction and/or the Y direction, thus being beneficial for the miniaturization and high-density integration of the package.

Additional aspects and advantages of the disclosure will be given in part in the following description, which can become apparent from the following description or be understood through practice of the disclosure.

BRIEF DESCRIPTION OF THE DRAWINGS

The above and/or additional aspects and advantages of the disclosure will be apparent and easily understood from the description of the embodiments with reference to the following drawings, where:

FIG. 1 is a flow chart of a manufacturing method of an embedded packaging structure according to an embodiment of the disclosure; and FIG. 2 to FIG. 17 are cross-sectional views of an embedded packaging structure in intermediate processes of the manufacturing method of an embedded packaging structure according to embodiments of the disclosure.

Figure 2:
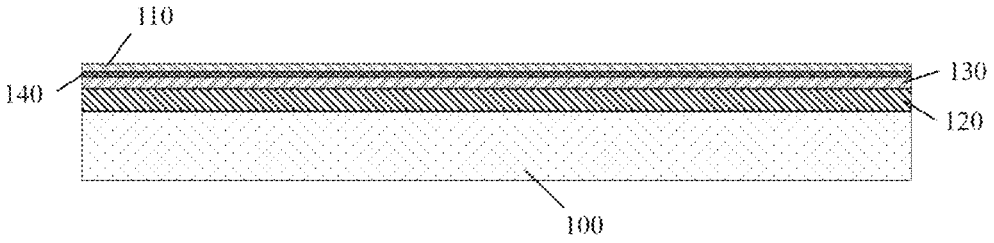

Reference numerals are as follows:

100 refers to bearing plate, 110 refers to first metal seed layer, 120 refers to first metal layer, 130 refers to second metal layer, and 140 refers to etching barrier layer;

200 refers to substrate, 210 refers to first photoresist layer, 211 refers to first pattern, 220 refers to first circuit layer, 221 refers to first conductive circuit, 222 refers to first sacrificial circuit, 223 refers to second sacrificial circuit, 230 refers to second photoresist layer, 231 refers to second pattern, 240 refers to first metal column, 241 refers to first conductive metal column, 242 refers to first sacrificial metal column, 243 refers to second sacrificial metal column, and 250 refers to first insulating layer;

261 refers to third photoresist layer, 262 refers to fourth photoresist layer, 263 refers to fifth photoresist layer, 271 refers to first cavity, 272 refers to second cavity, 281 refers to second insulating layer, 282 refers to second metal seed layer, 283 refers to second circuit layer, 290 refers to sixth photoresist layer, and 291 refers to third pattern; and 300 refers to first component, 400 refers to connecting flexible board, 500 refers to temporary bearing layer, 600 refers to second component, and 700 refers to packaging layer.

DETAILED DESCRIPTION

Embodiments of the present disclosure will be described in detail below. Examples of the embodiments are illustrated in the accompanying drawings, where the same or like reference numerals throughout the figures indicate the same or like elements having the same or like functions. The embodiments described below with reference to the accompanying drawings are exemplary and are intended only to explain the present disclosure instead of being construed as limiting the present disclosure.

In the description of the present disclosure, it should be understood that, descriptions relating to orientation, for example, orientation or positional relationships indicated by "up", "down", "front", "back", "left", "right", etc. are based on the orientation or positional relationships shown in the accompanying drawings, and are to facilitate the description of the present disclosure and simplify the description only, rather than indicating or implying that the device or element referred to must have a specific orientation or be constructed and operated in a specific orientation, and therefore cannot be construed as limiting the present disclosure.

In the description of the present disclosure, the meaning of "several" is one or more, the meaning of "a plurality of" is two or more, "greater than", "less than", "more than", etc. are to be understood to exclude the given figure, and "above", "below", "within", etc. are understood to include the given figure. If the terms "first", "second", "third", "fourth", "fifth", "sixth" or the like are referred to, it is only for the purpose of distinguishing technical features, and shall not be understood as indicating or implying relative importance or implying the number of the indicated technical features or implying the sequence of the indicated technical features.

In the description of the present disclosure, unless otherwise explicitly defined, the words such as "set", "install", and "connect" should be understood in a broad sense, and those skilled in the art can determine the specific meanings of the above words in the present disclosure in a rational way in combination with the specific contents of the technical solutions.

With reference to FIG. 1, a manufacturing method of an embedded packaging structure includes step S1000, step S2000, step S3000, step S4000, step S5000 and step S6000.

In step S1000, a bearing plate 100 is provided, where a first metal seed layer 110 is arranged on the bearing plate 100.

Specifically, with reference to FIG. 2, the bearing plate 100 is configured for bearing a substrate 200; and the first metal seed layer 110 is used as a basis for electroplating, so as to facilitate subsequent processing to obtain the substrate 200.

In some embodiments, a first metal layer 120, a second metal layer 130 and an etching barrier layer 140 are sequentially arranged on the bearing plate 100, and the first metal seed layer 110 is located on the etching barrier layer 140. The first metal layer 120 and the second metal layer 130 are detachably connected, such as by snap-fit connection, adhesive connection and plug connection, so as to facilitate subsequent removal of the bearing plate 100. The first metal layer 120 and the second metal layer 130 are configured for splitting the substrate 200 from the bearing plate 100 subsequently; and the etching barrier layer 140 is configured for isolating the second metal layer 130 from the first metal seed layer 110, so as to prevent over etching when the second metal layer 130 is removed.

In step S2000, processing is performed on the first metal seed layer 110 to obtain the substrate 200, where the substrate 200 includes a first circuit layer 220, a first metal column 240 and a first insulating layer 250, the first circuit layer 220 and the first metal column 240 are both located in the first insulating layer 250, and the first metal column 240 is also located on the first circuit layer 220.

With reference to FIG. 2 to FIG. 7, based on the first metal seed layer 110, the first circuit layer 220 and the first metal column 240 are sequentially obtained by electroplating, and finally, an insulating material is filled to obtain the first insulating layer 250, thus obtaining the substrate 200 to facilitate subsequent processing based on the substrate 200.

Step S2000 may include step S2100, step S2200 and step S2300.

In step S2100, processing is performed on the first metal seed layer 110 to obtain the first circuit layer 220, where the first circuit layer 220 includes a first conductive circuit 221, a first sacrificial circuit 222 and a second sacrificial circuit 223.

Figure 3:
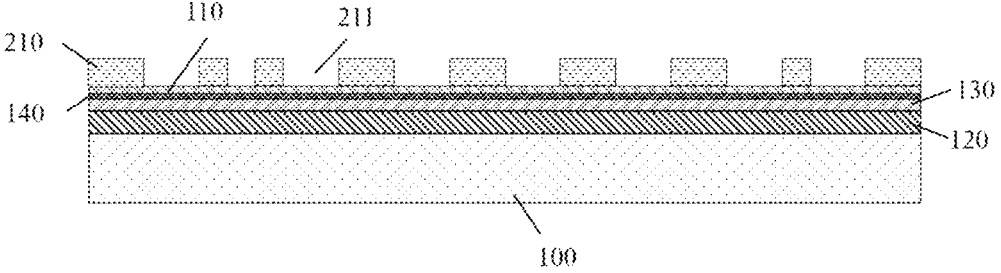
Figure 4:
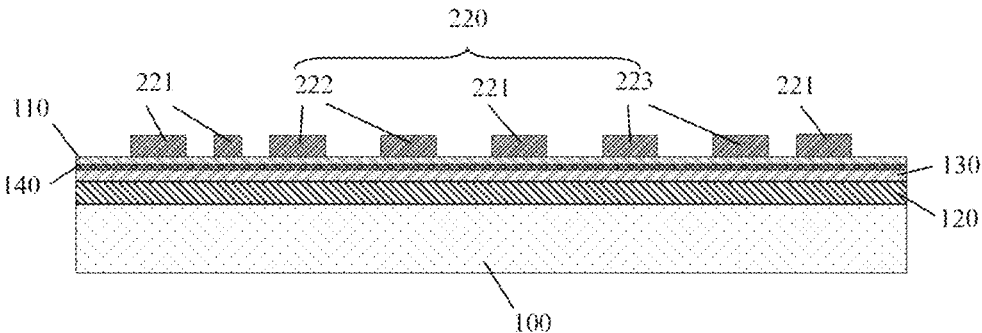

With reference to FIG. 3, a photoresist material is applied on the first metal seed layer 110 by pasting or coating, and the photoresist material applied on the first metal seed layer 110 is exposed and developed according to production data to obtain a first photoresist layer 210 with a first pattern 211. With reference to FIG. 4, based on the first pattern 211 of the first photoresist layer 210, processing is performed on the first metal seed layer 110 to obtain the first circuit layer 220 by electroplating, and then the first photoresist layer 210 is removed. The first circuit layer 220 includes the first conductive circuit 221, the first sacrificial circuit 222 and the second sacrificial circuit 223. The first conductive circuit 221 is used as a basis for subsequent circuit conduction; and the first sacrificial circuit 222 and the second sacrificial circuit 223 are configured for subsequent formation of corresponding metal columns, so as to facilitate subsequent processing to obtain the first cavity 271 and the second cavity 272.

In step S2200, processing is performed on the first circuit layer 220 to obtain the first metal column 240, where the first metal column 240 includes a first conductive metal column 241 located on the first conductive circuit 221, a first sacrificial metal column 242 located on the first sacrificial circuit 222 and a second sacrificial metal column 243 located on the second sacrificial circuit 223.

Figure 5:
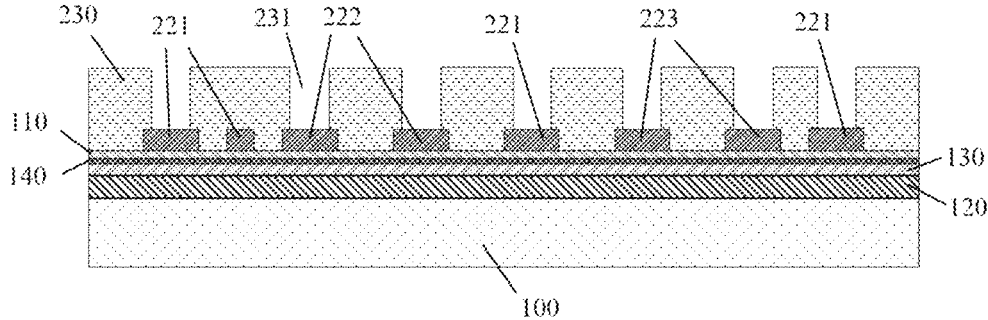
Figure 6:
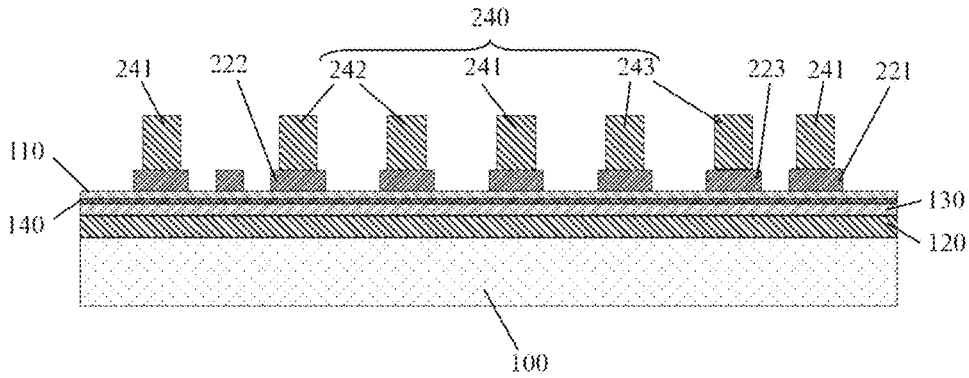

With reference to FIG. 5, photoresist materials are applied on the first metal seed layer 110 and the first circuit layer 220 by pasting or coating, and the photoresist materials applied on the first metal seed layer 110 and the first circuit layer 220 are exposed and developed according to production data to obtain a second photoresist layer 230 with a second pattern 231. With reference to FIG. 6, based on the second pattern 231 of the second photoresist layer 230, processing is performed on the first circuit layer 220 to obtain the first metal column 240 by electroplating, and then the second photoresist layer 230 is removed. The first metal column 240 includes the first conductive metal column 241 located on the first conductive circuit 221, the first sacrificial metal column 242 located on the first sacrificial circuit 222 and the second sacrificial metal column 243 located on the second sacrificial circuit 223. The first conductive metal column 241 is configured for electrically connecting the first conductive circuit 221 with a second circuit layer 283 obtained by subsequent processing, also used as a basis for supporting the substrate 200 obtained by subsequent processing at the same time, and configured for heat dissipation. The first sacrificial metal column 242 and the second sacrificial metal column 243 are configured for defining a size and a location of the cavity obtained by subsequent processing, and have a support function during processing to obtain the substrate 200 at the same time.

In step S2300, processing is performed between gaps of the first circuit layer 220 and gaps of the first metal column 240 by using the insulating material to obtain the first insulating layer 250, and the substrate 200 is obtained.

Figure 7:
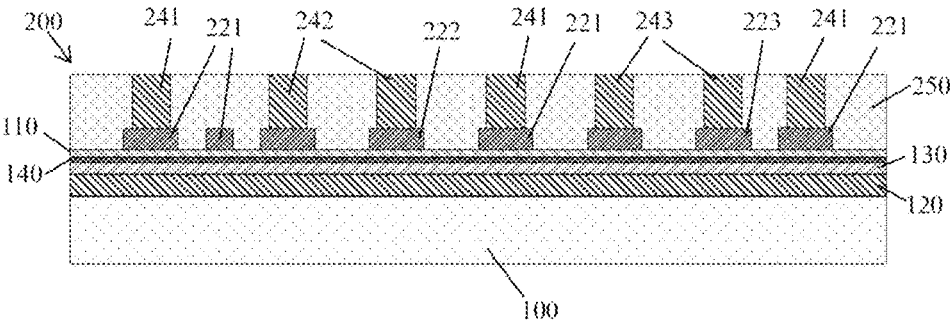

With reference to FIG. 7, the insulating material is applied between gaps of the first circuit layer 220 and gaps of the first metal column 240 by coating or pressing, so that the gaps of the first circuit layer 220 and the gaps of the first metal column 240 are filled with the insulating material to obtain the first insulating layer 250, so as to form the substrate 200.

Step S2300 may further include step S2310 and step S2320.

In step S2310, the insulating material is applied on the first metal seed layer 110, so that the insulating material covers the first metal column 240 and the first circuit layer 220 to obtain an insulating base layer.

In step S2320, processing is performed on the insulating base layer, an end portion of the first metal column 240 is exposed from the insulating base layer to obtain the first insulating layer 250, and the substrate 200 is obtained.

With reference to FIG. 7, the insulating material is applied on the first metal seed layer 110 by coating or pressing, and the insulating material covers the first circuit layer 220 and the first metal column 240, so as to obtain the insulating base layer (not shown in the drawings). At the moment, the first metal column 240 is located in the insulating base layer, and the insulating base layer is thick, and then the insulating base layer is thinned by ion etching or grinding, so that the end portion of the first metal column 240 is exposed from the insulating base layer to obtain the first insulating layer 250. The first insulating layer 250 is obtained through step S2310 and step S2320, which is beneficial for reducing processing difficulty.

It should be noted that the end portion of the first metal column 240 refers to one end on the first metal column 240 far away from the first circuit layer 220. Assuming that a first end of the first metal column 240 is connected with the first circuit layer 220, and a second end of the first metal column 240 is opposite to the first end of the first metal column 240 and far away from the first circuit layer 220 compared with the first end of the first metal column 240, then the second end of the first metal column 240 is the end portion of the first metal column 240.

In step S3000, the bearing plate 100 is removed to obtain the substrate 200, and processing is performed on the substrate 200 to obtain a first cavity 271 and a second cavity 272 which penetrate through the substrate 200.

Figure 8:
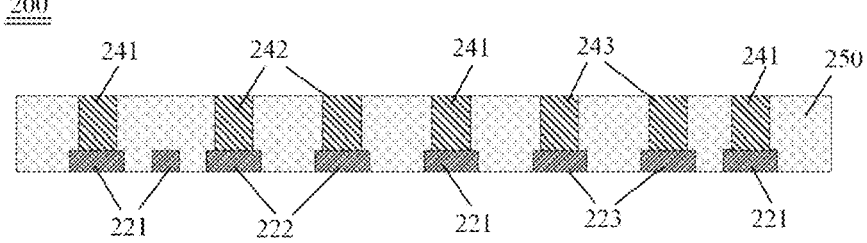
Figure 9:
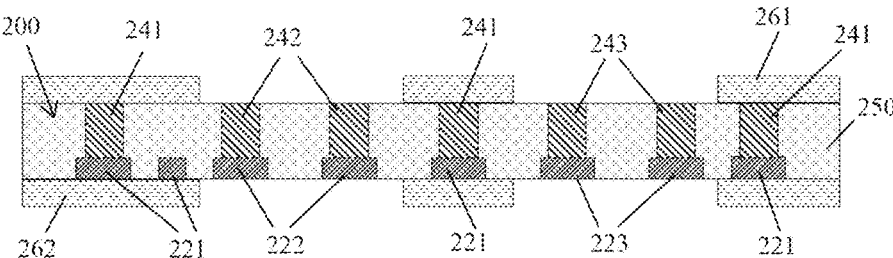
Figure 10:
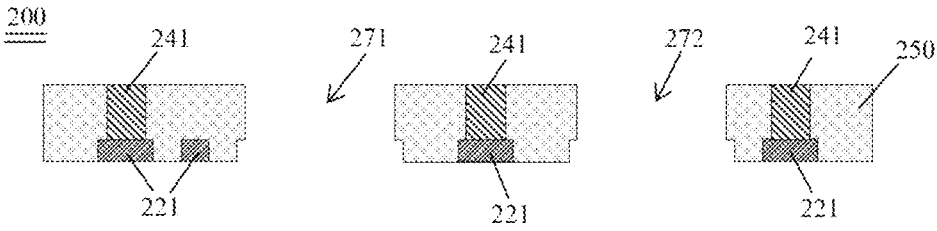

With reference to FIG. 8 to FIG. 10, after the first insulating layer 250 is formed, the substrate 200 is obtained. At the moment, the bearing plate 100 is removed to obtain the substrate 200, so as to facilitate subsequent processing of the substrate 200. After the bearing plate 100 is removed, the substrate 200 may be processed by etching to obtain the first cavity 271 and the second cavity 272, so as to facilitate subsequent assembly of a first component 300 and a connecting flexible board 400.

In some embodiments, a first metal layer 120, a second metal layer 130 and an etching barrier layer 140 are sequentially arranged on the bearing plate 100, and the first metal seed layer 110 is located on the etching barrier layer 140, then removing the bearing plate 100 to obtain the substrate 200 in step S3000 includes step S3100.

In step S3100, the first metal layer 120 is split from the second metal layer 130, and the second metal layer 130, the etching barrier layer 140 and the first metal seed layer 110 are sequentially removed by etching, so as to remove the bearing plate 100 and obtain the substrate 200.

The first metal layer 120 and the second metal layer 130 are detachably connected by snap-fit connection or adhesive connection, so that when the bearing plate 100 is removed, the first metal layer 120 may be directly split from the second metal layer 130, and then, according to a material of the second metal layer 130, a material of the etching barrier layer 140 and a material of the first metal seed layer 110, corresponding etchants are selected and used for etching sequentially to remove the bearing plate 100. For example, when the etching barrier layer 140 is removed, a nickel etchant may be used. The second metal layer 130, the etching barrier layer 140 and the first metal seed layer 110 are removed by etching sequentially to avoid over etching.

Performing processing on the substrate 200 to obtain a first cavity 271 and a second cavity 272 which penetrate through the substrate 200 in step S3000 includes step S3200 and step S3300.

In step S3200, the first sacrificial circuit 222 and the first sacrificial metal column 242 are removed to form the first cavity 271 penetrating through the substrate 200.

In step S3300, the second sacrificial circuit 223 and the second sacrificial metal column 243 are removed to form the second cavity 272 penetrating through the substrate 200.

With reference to FIG. 9 and FIG. 10, photoresist materials are applied on the first side of the substrate 200 and the second side of the substrate 200 by pasting or coating, so that a third photoresist layer 261 is formed on the first side of the substrate 200, and a fourth photoresist layer 262 is formed on the second side of the substrate 200. The third photoresist layer 261 and the fourth photoresist layer 262 cooperatively hide the first conductive circuit 221 and the first conductive metal column 241 between the third photoresist layer 261 and the fourth photoresist layer 262, and the first sacrificial circuit 222, the second sacrificial circuit 223, the first sacrificial metal column 242 and the second sacrificial metal column 243 are exposed in an opening of the third photoresist layer 261 and an opening of the fourth photoresist layer 262, so as to facilitate removal of the first sacrificial circuit 222, the second sacrificial circuit 223, the first sacrificial metal column 242 and the second sacrificial metal column 243 by etching, thus respectively forming the first cavity 271 and the second cavity 272 which penetrate through the substrate 200, and then removing the third photoresist layer 261 and the fourth photoresist layer 262.

In step S4000, the first component 300 is assembled in the first cavity 271, the connecting flexible board 400 is assembled in the second cavity 272, and processing is performed on the second side of the substrate 200 by using a photosensitive insulating material to obtain a second insulating layer 281, so as to fix the first component 300 and the connecting flexible board 400.

Figure 11:
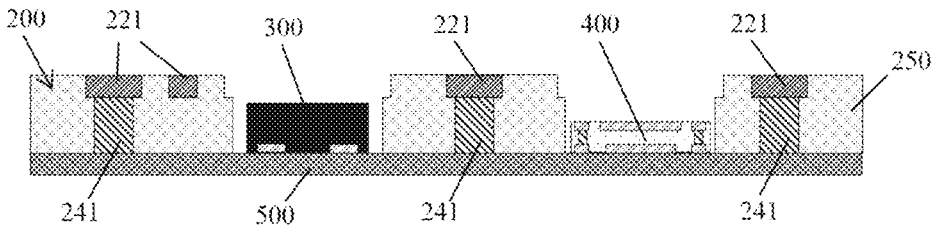
Figure 12:
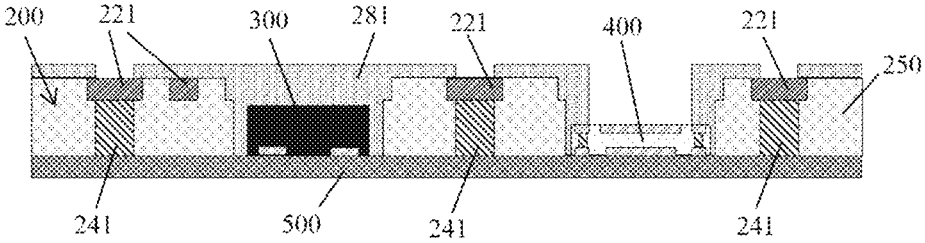

With reference to FIG. 11 and FIG. 12, after the first component 300 is assembled in the first cavity 271 and the connecting flexible board 400 is assembled in the second cavity 272, the photosensitive insulating material is applied on the second side of the substrate 200 by coating or pressing, and then exposed and developed to make local areas of the first circuit layer 220 and the connecting flexible board 400 expose from the photosensitive insulating material applied on the second side of the substrate 200, thus forming the second insulating layer 281. The first circuit layer 220 is exposed to facilitate use of the first circuit layer 220 as a circuit interface; and the local area of the connecting flexible board 400 is exposed to facilitate bending of the connecting flexible board 400, thus facilitating subsequent processing. The second insulating layer 281 is configured for fixing the first component 300 and the connecting flexible board 400 to prevent the first component 300 and the connecting flexible board 400 from falling off the substrate 200. Meanwhile, the second insulating layer 281 is further configured for protecting the substrate 200, which is beneficial for improving a structural strength of the substrate 200.

Assembling the first component 300 in the first cavity 271, and assembling the connecting flexible board 400 in the second cavity 272 in step S4000 may include step S4100 and step S4200.

In step S4100, a temporary bearing layer 500 is mounted on the first side of the substrate 200, where the first side of the substrate 200 is opposite to the second side of the substrate 200, and the first circuit layer 220 is located on the second side of the substrate 200.

In step S4200, the first component 300 and the connecting flexible board 400 are pre-mounted on the temporary bearing layer 500, where the first component 300 is located in the first cavity 271, and the connecting flexible board 400 is located in the second cavity 272.

With reference to FIG. 11, the temporary bearing layer 500 is mounted to bear the first component 300 and the connecting flexible board 400, and provide a certain fixing function, so as to facilitate definition of locations of the first component 300 and the connecting flexible board 400, so that the first component 300 and the connecting flexible board 400 can be accurately fixed on proper locations when the second insulating layer 281 is obtained by subsequent processing with the photosensitive insulating material. The temporary bearing layer 500 may be made of an adhesive tape or a metal plate, and may be mounted by sticking or clamping.

In addition, after step S4000, the method further includes step S4300.

In step S4300, the temporary bearing layer 500 is removed.

After the second insulating layer 281 is obtained by processing, the second insulating layer 281 fixes the first component 300 and the connecting flexible board 400 on the substrate 200. At the moment, the temporary bearing layer 500 may be removed, so as to facilitate subsequent processing on the first side of the substrate 200.

In step S5000, processing is performed on the first side of the substrate 200 to obtain the second circuit layer 283, and a second component 600 is assembled on the second circuit layer 283, so that the first metal column 240 and the first component 300 are electrically connected with the second component 600 through the second circuit layer 283 respectively.

With reference to FIG. 13 to FIG. 16, the processing may be performed on the first side of the substrate 200 to obtain corresponding second circuit layer 283 by electroplating according to production data, and then the second component 600 is assembled on the second circuit layer 283, so as to facilitate formation of a complete circuit structure by the first circuit layer 220, the first metal column 240, the first component 300 and the second component 600.

Performing processing on the first side of the substrate 200 to obtain the second circuit layer 283 in step S5000 may further include step S5100 and step S5200.

In step S5100, processing is performed on the first side of the substrate 200 to obtain a second metal seed layer 282.

In step S5200, processing is performed on the second metal seed layer 282 to obtain the second circuit layer 283.

Figure 13:
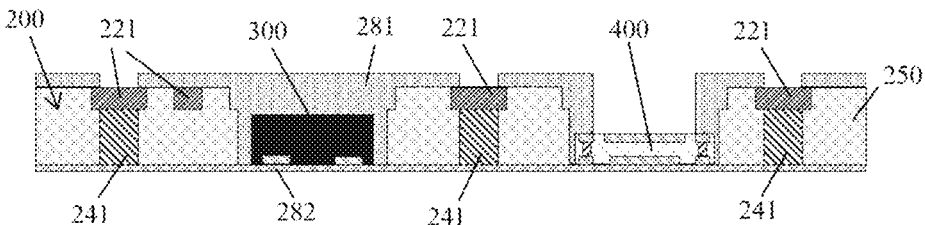
Figure 14:
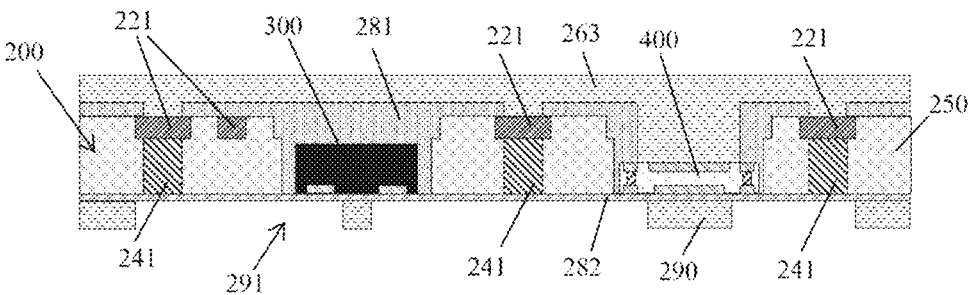
Figure 15:
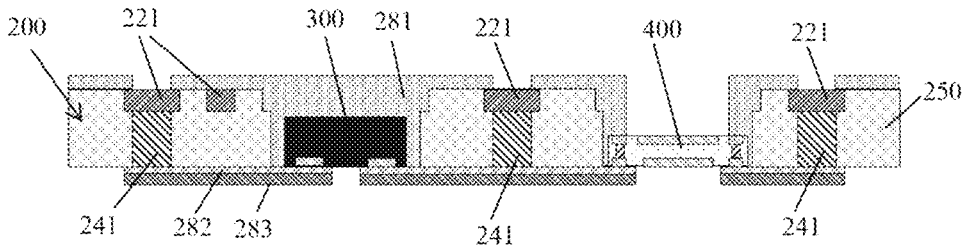
Figure 16:
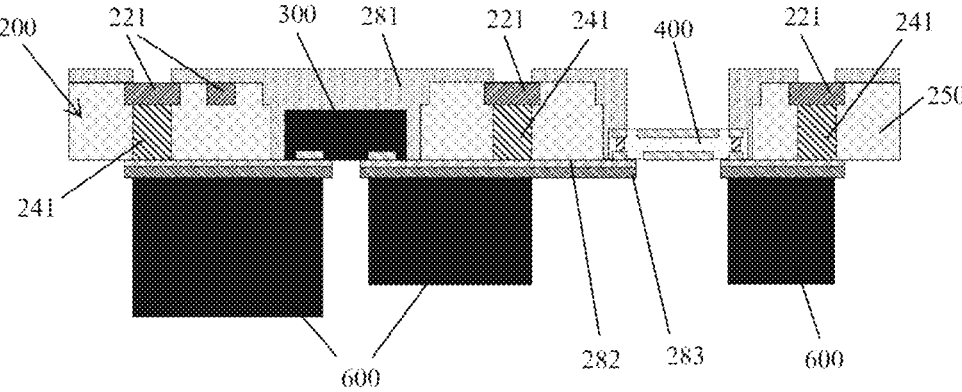

With reference to FIG. 13, metal, such as titanium or copper, is sputtered on the first side of the substrate 200 to obtain the second metal seed layer 282. With reference to FIG. 14, photoresist materials are applied on the second side of the substrate 200 and the second metal seed layer 282 on the first side of the substrate 200 by pasting or coating, thus forming a fifth photoresist layer 263 on the second side of the substrate 200, and then the photoresist material located on the second metal seed layer 282 is exposed and developed according to production data to form a sixth photoresist layer 290 with a third pattern 291 on the second metal seed layer 282. With reference to FIG. 15, based on the third pattern 291 of the sixth photoresist layer 290, processing is performed on the second metal seed layer 282 to obtain the second circuit layer 283 by electroplating. Step S5100 and step S5200 are beneficial for reducing processing difficulty and obtaining the second circuit layer 283 with a better yield.

In step S6000, the substrate 200 is bent through the connecting flexible board 400 to form an included angle less than 180 degrees on the first side of the substrate 200, and the first side of the substrate 200 is packaged by using a packaging material to obtain a packaging layer 700.

With reference to FIG. 17, based on flexibility of the connecting flexible board 400, the substrate 200 is bent downwardly to form the included angle less than 180 degrees on the first side of the substrate 200. In the embodiment, the included angle is 90 degrees, so as to facilitate effective reduction of a size of the substrate 200 in an X direction and a Y direction. After bending the substrate 200, the first side of the substrate 200 is packaged by using the packaging material to obtain the packaging layer 700. The packaging layer 700 is configured for protecting the second component 600 and the second circuit layer 283 on the first side of the substrate 200, and configured for fixing the bent substrate 200 at the same time to prevent the substrate 200 from moving through the connecting flexible board 400.

Through step S6000, the embedded packaging structure with effectively reduced size in the X direction and the Y direction is finally obtained, which means that the embedded packaging structure manufactured by the manufacturing method of an embedded packaging structure above is beneficial for miniaturization and high-density integration of a package.

It should be noted that, with reference to FIG. 17, the X direction is located in left and right directions, and the Y direction is perpendicular to the X direction and is in up and down directions.

The embodiments of the disclosure are described in detail with reference to the drawings above, but the disclosure is not limited to the above embodiments, and various changes may also be made within the knowledge scope of those of ordinary skills in the art without departing from the gist of the disclosure.

The invention claimed is:

1. A manufacturing method of an embedded packaging structure, comprising:

providing a bearing plate, wherein a first metal seed layer is arranged on the bearing plate;

processing on the first metal seed layer to obtain a substrate, wherein the substrate comprises a first circuit layer, a first metal column and a first insulating layer, the first circuit layer and the first metal column are both located in the first insulating layer, and the first metal column is further located on the first circuit layer;

removing the bearing plate to obtain the substrate, and processing on the substrate to obtain a first cavity and a second cavity which penetrate through the substrate;

assembling a first component in the first cavity, assembling a connecting flexible board in the second cavity, and processing on a second side of the substrate by using a photosensitive insulating material to obtain a second insulating layer covering the first component making local areas of the first circuit layer and the connecting flexible board exposed, so as to fix the first component and the connecting flexible board;

processing on a first side of the substrate to obtain a second circuit layer, and assembling a second component on the second circuit layer, so that the first metal column and the first component are electrically connected with the second component through the second circuit layer respectively; and bending the substrate through the connecting flexible board to form an included angle less than 180 degrees on the first side of the substrate, and packaging the first side of the substrate by using a packaging material to obtain a packaging layer.

2. The manufacturing method of an embedded packaging structure according to claim 1, wherein the processing on the first metal seed layer to obtain the substrate comprises:

processing on the first metal seed layer to obtain the first circuit layer, wherein the first circuit layer comprises a first conductive circuit, a first sacrificial circuit and a second sacrificial circuit;

processing on the first circuit layer to obtain the first metal column, wherein the first metal column comprises a first conductive metal column located on the first conductive circuit, a first sacrificial metal column located on the first sacrificial circuit and a second sacrificial metal column located on the second sacrificial circuit; and processing between gaps of the first circuit layer and gaps of the first metal column by using the insulating material to obtain the first insulating layer, thereby obtaining the substrate.

3. The manufacturing method of an embedded packaging structure according to claim 2, wherein the processing between gaps of the first circuit layer and gaps of the first metal column by using the insulating material to obtain the first insulating layer, thereby obtaining the substrate, comprises:

applying the insulating material on the first metal seed layer, so that the insulating material covers the first metal column and the first circuit layer to obtain an insulating base layer; and processing the insulating base layer, to expose an end portion of the first metal column from the insulating base layer to obtain the first insulating layer, thereby obtaining the substrate.

4. The manufacturing method of an embedded packaging structure according to claim 2, wherein the processing on the substrate to obtain a first cavity and a second cavity which penetrate through the substrate comprises:

removing the first sacrificial circuit and the first sacrificial metal column to form the first cavity penetrating through the substrate; and removing the second sacrificial circuit and the second sacrificial metal column to form the second cavity penetrating through the substrate.

5. The manufacturing method of an embedded packaging structure according to claim 1, wherein a first metal layer, a second metal layer and an etching barrier layer are sequentially arranged on the bearing plate, the first metal seed layer is located on the etching barrier layer, and the removing the bearing plate to obtain the substrate comprises:

splitting the first metal layer from the second metal layer, and sequentially removing the second metal layer, the etching barrier layer and the first metal seed layer by etching, so as to remove the bearing plate and obtain the substrate.

6. The manufacturing method of an embedded packaging structure according to claim 1, wherein the assembling a first component in the first cavity and assembling a connecting flexible board in the second cavity, comprises:

mounting a temporary bearing layer on the first side of the substrate, wherein the first side of the substrate is opposite to the second side of the substrate, and the first circuit layer is located on the second side of the substrate; and pre-mounting the first component and the connecting flexible board on the temporary bearing layer, wherein the first component is located in the first cavity, and the connecting flexible board is located in the second cavity.

7. The manufacturing method of an embedded packaging structure according to claim 6, wherein the processing on a second side of the substrate by using a photosensitive insulating material to obtain a second insulating layer further comprises:

removing the temporary bearing layer.

8. The manufacturing method of an embedded packaging structure according to claim 1, wherein the processing on a first side of the substrate to obtain a second circuit layer comprises:

processing on the first side of the substrate to obtain a second metal seed layer; and processing on the second metal seed layer to obtain the second circuit layer.

* * * * *